(12) United States Patent
Park et al.

(10) Patent No.: US 6,558,878 B1
(45) Date of Patent: May 6, 2003

(54) MICROLENS MANUFACTURING METHOD

(75) Inventors: Hyo-Derk Park, Kyungki-do (KR); Suk-Won Jung, Choongcheongnam-do (KR); Kwang-Bum Park, Kyungki-do (KR); In-Hoe Kim, Kyungki-do (KR); Hyun-Chan Moon, Kyungki-do (KR); Kun-Nyun Kim, Kyungki-do (KR); Soon-Sup Park, Kyungki-do (KR); Sang-Mo Shin, Kyungki-do (KR)

(73) Assignee: Korea Electronics Technology Institute, Kyungki-Do (KR)

( * ) Notice: Subject to any disclaimer, the term of this patent is extended or adjusted under 35 U.S.C. 154(b) by 286 days.

(21) Appl. No.: 09/585,182

(22) Filed: Jun. 1, 2000

(30) Foreign Application Priority Data

Jul. 8, 1999 (KR) .............................................. 99-27428
Dec. 27, 1999 (KR) .............................................. 99-63040

(51) Int. Cl.⁷ .............................. G03F 7/00; G03F 7/20; G03F 7/207
(52) U.S. Cl. ...................... 430/321; 430/320; 430/322; 430/323; 430/324; 430/396; 430/397; 430/966; 378/34; 427/405; 427/367; 427/162
(58) Field of Search ................................ 430/320, 321, 430/322, 323, 324, 396, 397, 966; 378/34; 427/405, 367, 162

(56) References Cited

U.S. PATENT DOCUMENTS

| | | | |
|---|---|---|---|
| 4,266,138 A | * 5/1981 | Nelson, Jr. et al. | 250/492 |
| 4,514,857 A | * 4/1985 | Kimura et al. | 378/34 |
| 5,310,623 A | * 5/1994 | Gal | 430/321 |
| 5,482,800 A | * 1/1996 | Gal | 430/5 |
| 5,679,502 A | * 10/1997 | Siddons et al. | 430/397 |
| 5,728,509 A | * 3/1998 | Eda et al. | 430/321 |
| 5,953,492 A | * 9/1999 | Yabe et al. | 392/418 |
| 6,018,422 A | * 1/2000 | Feldman | 359/619 |
| 6,078,641 A | * 6/2000 | Mitsui et al. | 378/34 |
| 6,242,163 B1 | * 6/2001 | Stampfl et al. | 430/322 |
| 6,277,539 B1 | * 8/2001 | Bajikar et al. | 430/270.1 |
| 6,408,045 B1 | * 6/2002 | Matsui et al. | 318/34 |
| 6,411,362 B2 | * 6/2002 | Anderson et al. | 355/50 |
| 2001/0006762 A1 | * 7/2001 | Kwan et al. | 430/311 |
| 2001/0012696 A1 | * 8/2001 | Minakuti et al. | 438/707 |

* cited by examiner

Primary Examiner—Janet Baxter
Assistant Examiner—Amanda C. Walke
(74) Attorney, Agent, or Firm—Alston & Bird LLP

(57) ABSTRACT

Disclosed is a microlens manufacturing method which comprises the step of: positioning a X-ray mask for manufacturing the microlens on an substrate on which a sensitive film is formed, and arranging a rotation axis of the substrate and a central axis of the X-ray mask; applying X-rays to the X-ray mask to expose the sensitive film while fixing the X-ray mask and rotating the substrate; developing the sensitive film to form the microlens; performing an electroplating process on the plating base to form a metal layer; and separating the metal layer from the sensitive film structure and combining the metal layer with a mold frame for injection molding the microlens and manufacturing an injection mold.

11 Claims, 13 Drawing Sheets

MICROLENS MANUFACTURING METHOD

BACKGROUND OF THE INVENTION (a) Field of the Invention

The present invention relates to a microlens manufacturing method and a microlens injection mold manufacturing method. More specifically, the present invention relates to a method for precisely and easily manufacturing various microlenses by using an X-ray lithography technology which utilizes synchrotron radiation of a radiation accelerator.

(b) Description of the Related Art

Conventional microlens manufacturing methods are: injection molding microlens arrays by using precisely and mechanically cut dies; a planar array method that varies the refractive index through an ion exchange technique; and a method of photoresist patterning and melting using an ultraviolet lithography process.

A method for manufacturing a spherical microlens arrays by a PolyMethylMethAcrylate(PMAA) patterning and melting process which uses an IMM (Institute of Microtechnology Mainz—a German Lab.) process and a conventional X-ray lithography process is shown in FIG. 1.

FIG. 1 shows a spherical lens manufacturing process by using the conventional X-ray lithography process.

As shown in FIG. 1, the PMMA or sensitive film 2 is coated on a substrate 1, and a cylindrical pattern 2a is generated via an exposure and development process using an X-ray mask 3. The X-rays are exposed on the substrate 1 through a filter membrane 4. A heating process is performed on the coated and exposed substrate at a predetermined temperature so that the cylindrical PMMA is melted. When the cylindrical PMMA is cooled, a spherical lens 2b as shown in the drawing is finally manufactured. The diameter of the lens is determined by the diameter of the cylinder, and the diameter is determined before a heating process is performed on the cylinder. The height of the lens is determined by the diameter and height of the cylinder, as well as the temperature of the heating process, before the heating process is performed on the cylinder.

However, the conventional microlens manufacturing method has the following problems.

First, the techniques which use precision machine work and melting methods have difficulty in handling the machines and in implementing the lens types as only semi-cylindrical or semi-spherical lens types can be produced. That is, ball type or aspherical lenses cannot be manufactured, it is difficult to manufacture microlenses, and a precise controller for controlling working blades is required.

Second, to obtain desired microlens shapes and optical characteristics in the conventional melting techniques, temperature adjustments, and flow controls of the photoresist at the time of the melting process must be precisely performed, but, adjustments of a reproducible heating process is difficult, and it is difficult to fabricate thick photoresist so that it is difficult to manufacture lenses of a large size.

SUMMARY OF THE INVENTION

It is an object of the present invention to provide a method for precisely and easily manufacturing microlenses.

In one aspect of the present invention, a microlens manufacturing method using X-ray lithography comprises the steps of: (a) positioning an X-ray mask for manufacturing the microlens on a substrate on which a sensitive film is formed, and arranging a rotation axis of the substrate and a central axis of the X-ray mask; (b) exposing X-rays to the X-ray mask to expose the sensitive film while fixing the X-ray mask and rotating the substrate; and (c) developing the sensitive film to form the microlens.

In the step (b), the substrate is moved back and forth in an X-axis direction to make the rotation axis of the substrate identical with the central axis of the X-ray mask, and the substrate is moved back and forth in the Y-axis direction to adjust a thickness of the sensitive film exposed by the X-ray mask.

The X-ray mask comprises: a mask substrate permeable to X-rays; a holder fixedly installed on the mask substrate and having a hole; and an absorbing member for absorbing X-rays, including an inserter removably formed in the hole, and having a microlens form.

In the step (b), the substrate is positioned in a direction vertical to the absorbing member of the X-ray mask, and the substrate is rotated on the rotation axis 360° to be exposed.

Protrusions are formed on the inserter of the absorbing member of the X-ray mask, and installing holes corresponding to the protrusions are formed on the hole of the holder of the X-ray mask.

First protrusions are formed at an end of the inserter of the absorbing member, and first installing holes are formed at positions corresponding to the first protrusions, and second installing holes are formed at a side of the inserter of the absorbing member, and second protrusions are formed on the positions corresponding to the second installing holes of the hole of the holder.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

In the preferred embodiment of the present invention, an X-ray mask to be used in an exposure process is manufactured according to desired microlens types, and by using this X-ray mask, the exposure process is performed to manufacture the microlens. Here, an X-ray exposure is performed which uses synchrotron radiation that is output from the radiation accelerator.

In the first preferred embodiment of the present invention, a microlens manufacturing method is described, and the microlens manufactured in the first preferred embodiment is an aspherical lens.

Figure 1:
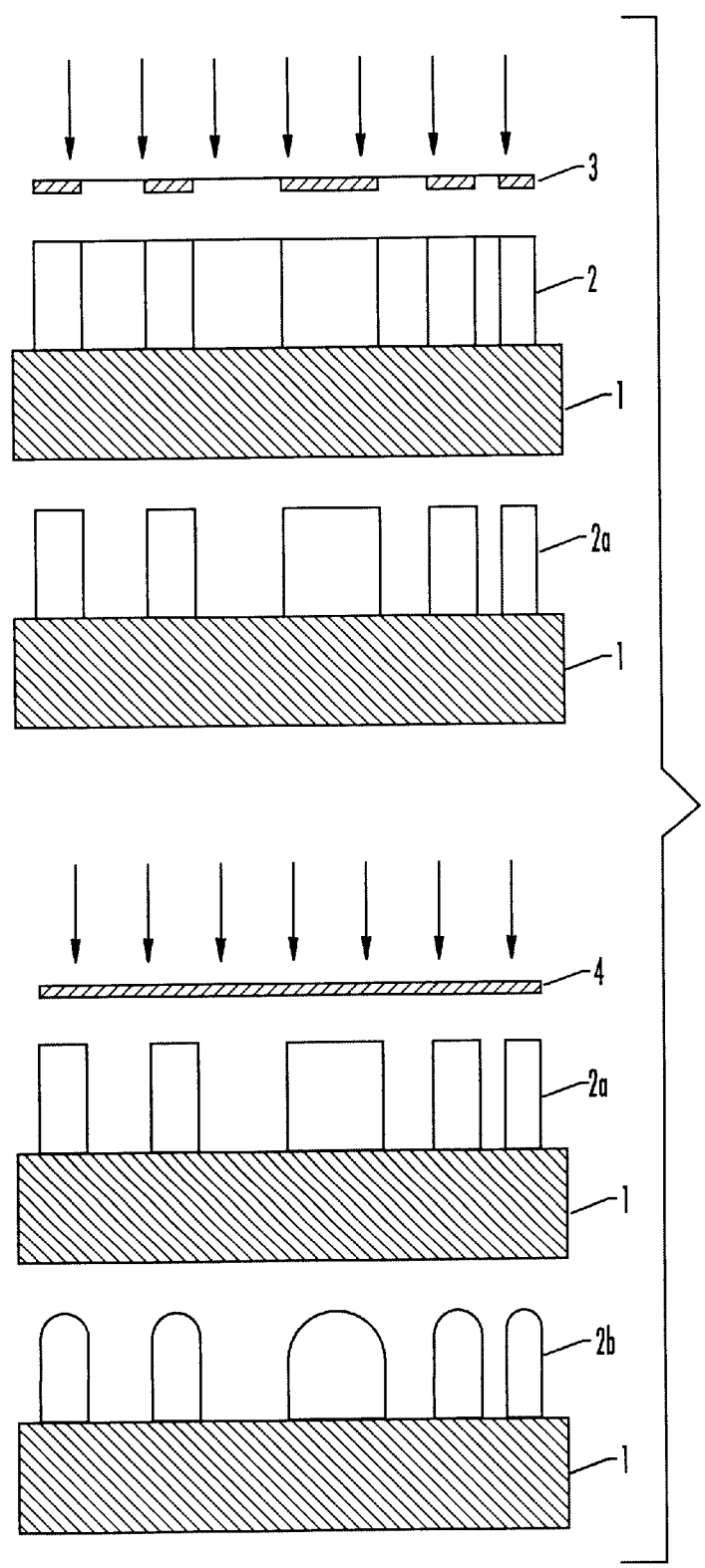
FIG. 1 shows a process for manufacturing an aspherical lens using a conventional X-ray lithography process.
Figure 2:
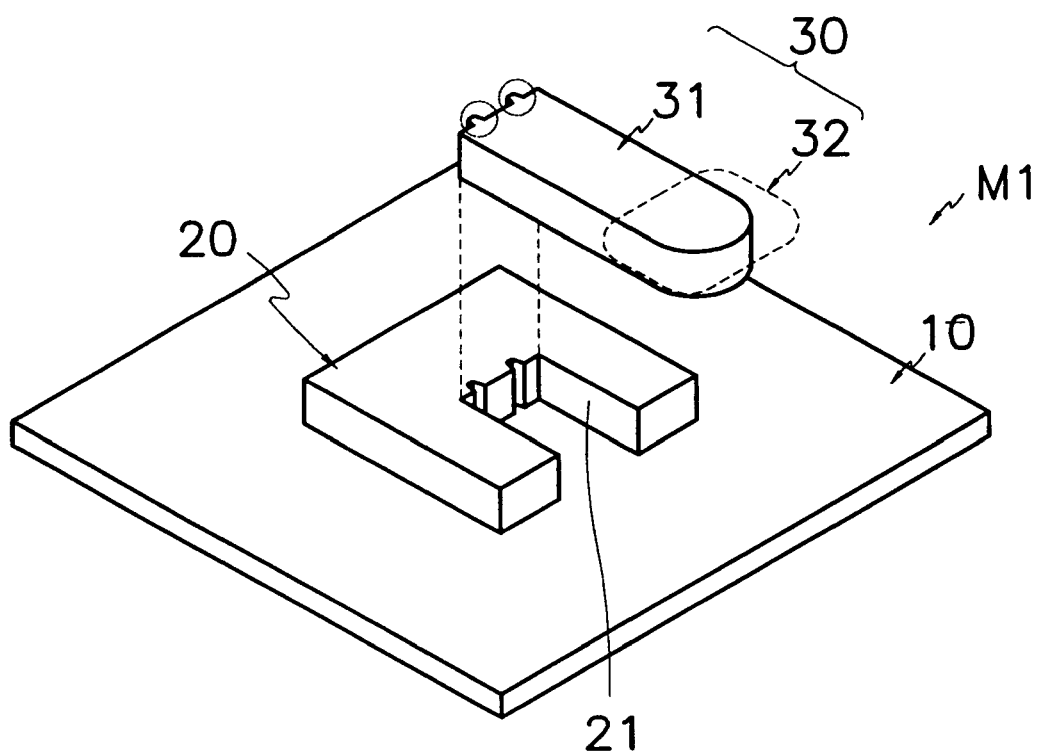
FIG. 2 shows an X-ray mask for manufacturing microlenses according to a first preferred embodiment of the present invention.

FIG. 2 shows an X-ray mask according to the first preferred embodiment of the present invention.

As shown in FIG. 2, the X-ray mask comprises a holder 20 which is installed on a substrate 10 and includes a hole 21, and an absorbing member 30 which includes an inserter 31 to be removably connected to the hole 21 and a pattern unit 32 that varies according to the form of the microlens.

The absorbing member 30 is made of material that absorbs the X-rays, and the substrate 10 is made of material that is penetrated by X-rays, such as a Si substrate, metallic substrate, or glass substrate. The holder 20 is made of the same material as the absorbing member 30.

FIGS. 3(a) through (e) sequentially show processes for manufacturing the exposure mask.

Figure 3A:
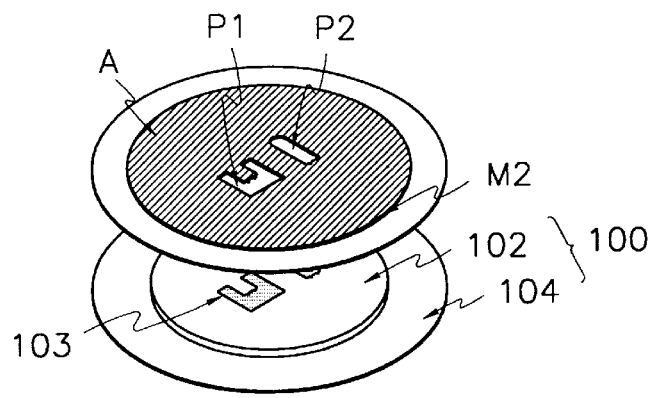
FIGS. 3(a) through (e) show sequential exposure mask processes for manufacturing the microlenses according to a first preferred embodiment of the present invention.

As shown in FIG. 3(a), to produce a mask substrate 100, a PMMA 102, or a sensitive film which can react to X-rays and has a predetermined thickness is formed on a substrate 104.

A mask M2 for manufacturing the X-ray mask is placed on the substrate 100, a radiation accelerator (not illustrated) starts to be driven, and X-rays are applied to the mask M2.

The mask M2, as shown in FIG. 3(a), comprises a first pattern P1 for forming the holder 20 of the X-ray mask M1; a second pattern P2 for forming the absorbing member 30; and an absorber A which comprises the remaining area excluding the first and second patterns P1 and P2 and absorbs the X-rays. The first and second patterns P1 and P2 are penetrated by the X-rays.

As the X-rays are applied to the mask M2, the X-rays applied to the first and second patterns P1 and P2 pass through the patterns and are applied to the PMMA 102, and the X-rays applied to the absorber A of the mask M2 are absorbed by the absorber A, and therefore are not applied to the PMMA 102. The process of applying the X-rays is finished when the X-ray energy is fully stored in the bottom of the PMMA 102. Therefore, as shown in FIG. 3(a), an area 103 corresponding to the first and second patterns P1 and P2 is formed on the PMMA 102.

Figure 3B:
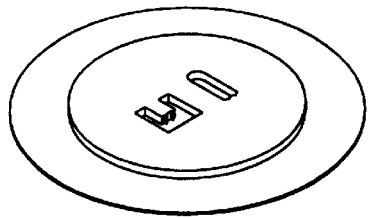

The PMMA 102 on which the X-rays are partially applied is settled into a developing solution, which is a mixture of 2-ethanol, 2-aminoethanol, morpholine and water, and then developed. The exposure area 103 of the PMMA 102 is thereby etched, and the area on which the X-rays are not applied remains as shown in FIG. 3(b).

Sonic waves (such as ultrasonic waves) can be added while performing this developing process so that the developing solution quickly permeates the PMMA 102 and the portion on which the X-rays are applied is quickly etched.

Figure 3C:
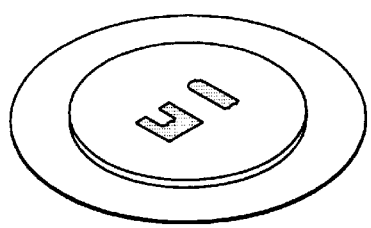
Figure 3D:
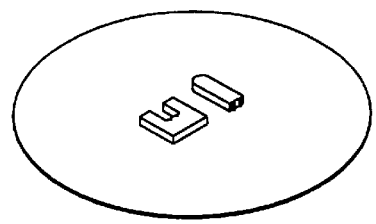
Figure 3E:
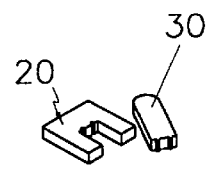

Next, as shown in FIGS. 3(c) and (d), after the developing solution of the PMMA 102 has grown a metallic material and has filled in the etched part through an electroplating process, the remaining PMMA 102 is removed. Therefore, as shown in FIG. 3(e), the metallic molds, that is, the holder 20 and absorbing member 30, are completed.

Here, the metal used in the electrical coating process can function as the X-ray absorber, for example Au.

After the holder 20 is installed on the substrate 10, the absorbing member 30 is inserted in the hole 21 of the holder 20 so as to complete the exposure mask M1.

Since the absorbing member 30 can be removably installed on the holder 20, various types of absorbing members can be used without restriction to the illustrated type, and when installing the absorbing member 30 on the holder 20, the forms of the absorbing member 30 and the holder 20 can be modified in order for the absorbing member 30 to be firmly fixed on the holder 20.

Figure 4A:
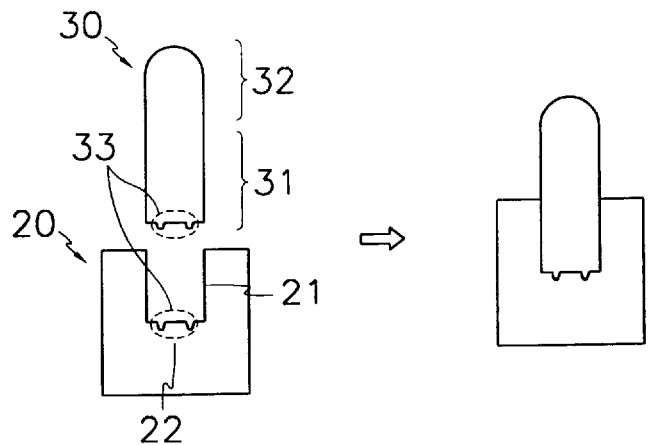
FIGS. 4(a) through (c) show various types of X-ray masks for manufacturing the microlenses according to a first preferred embodiment of the present invention.
Figure 4B:
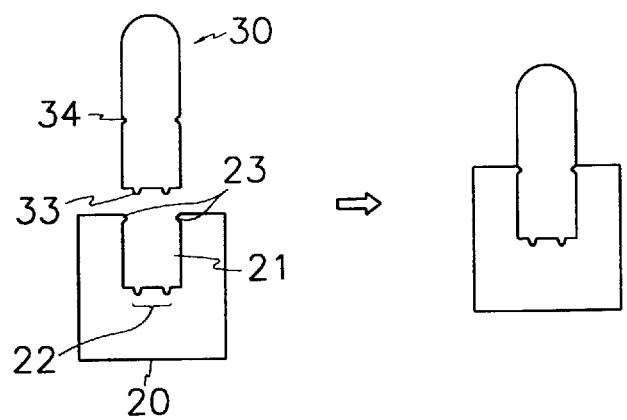
Figure 4C:
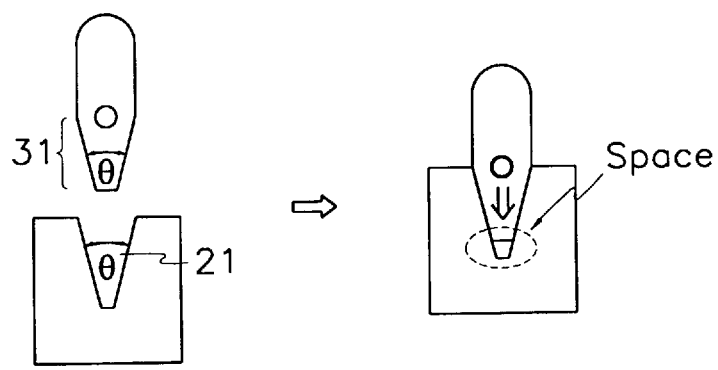

FIGS. 4(a) through (c) show various types of holders and absorbing members that improve fixation of the absorbing member.

As shown in FIG. 4(a), a first protrusion 33 can be formed at one end of the inserter 31 of the absorbing member 30 that is inserted into the holder 20, and first installing holes 22 corresponding to the first protrusion 33 can be formed on the hole 21 of the holder 20.

As shown in FIG. 4(b), to more firmly install the absorbing member 30 on the holder 20 compared to the case of FIG. 4(a), second installing holes 34 can be formed at sides of the absorbing member, and second protrusions 23 corresponding to the second installing holes 34 can be formed at the sides of the hole 21 of the holder 20. Accordingly, when the absorbing member 30 is installed on the holder 20, the first and second protrusions 33 and 23 combine with the first and second installing holes 22 and 34 so that the absorbing member 30 is prevented from being disconnected from the holder 20 during the exposure process.

On the other hand, the hole 21 of the holder 20 can be not only rectangular as shown in FIGS. 4(a) and (b), but also triangular as shown in FIG. 4(c). In this case, the inserting part 31 of the absorbing member 30 corresponding to the hole 21 can be formed as a triangle, and the inserting part 31 of the absorbing member 30 can be formed as a trapezoid in order for the inserting part 31 to be easily removed from and connected to the hole 21. Therefore, when the inserting part 31 of the absorbing member 30 installed in the hole 21 of the holder 20, a remaining space is generated between the hole 21 and the inserter 31.

Figure 5:
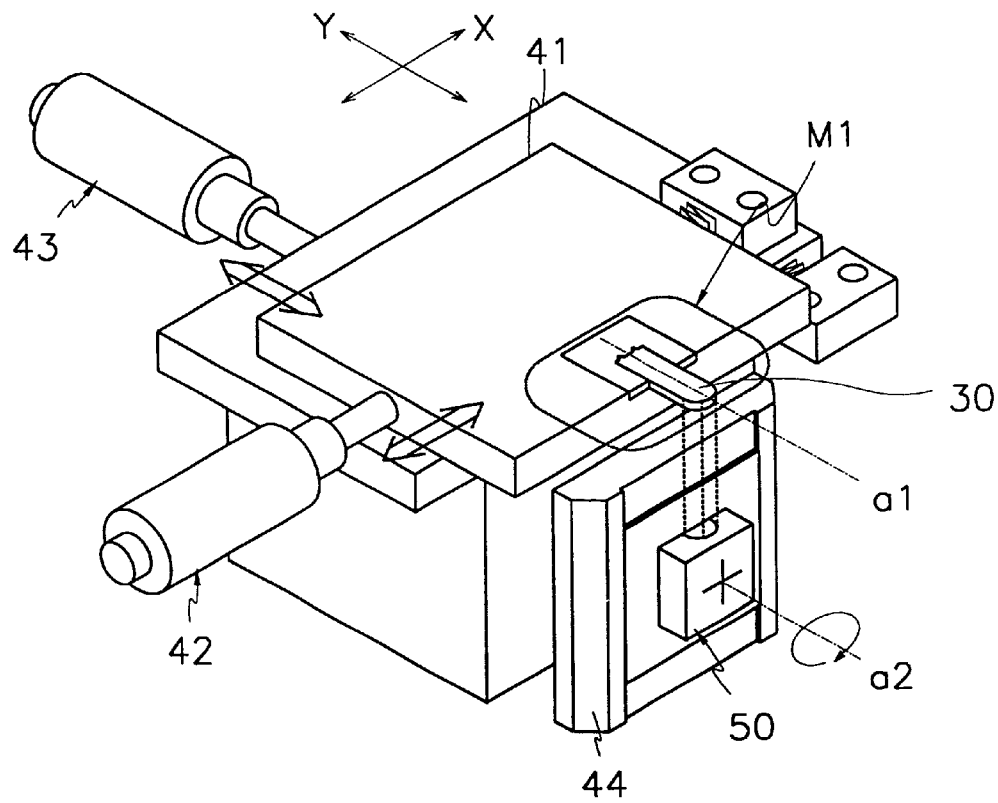
FIG. 5 shows an exposure apparatus for manufacturing the microlenses according to a first preferred embodiment of the present invention by using the exposure mask as shown in FIG. 2.

Next, the X-ray mask M1 configured as above is installed in the exposure apparatus for manufacturing the microlens. FIG. 5 shows an exposure apparatus for manufacturing the microlens according to the first preferred embodiment of the present invention.

Referring to FIG. 5, the exposure apparatus comprises a stage 41 which is installed to be moved in the X-axis and Y-axis directions over a predetermined distance; an X-axis direction micrometer 42 which moves the stage 41 back and forth in the X-axis direction; a Y-axis direction micrometer 43 which moves the stage 41 back and forth in the Y-axis direction; and a substrate holder 44 on which a substrate 50 is installed to manufacture the microlenses.

First, as shown in FIG. 5, the substrate 50 for manufacturing the microlenses is installed on the substrate holder 44. The X-ray mask M2 is positioned on the stage 41, and is arranged so that a central axis a1 of the absorbing member 30 of the X-ray mask M1 becomes identical with a rotation axis a2 of the exposure substrate 50 installed on the substrate holder 44 by using the X-axis direction micrometer 42.

Generally, to manufacture three dimensional objects such as lenses, the substrate 50 on which the X-ray is applied when performing the lithography process using X-rays must rotate on the rotation axis a2, and thereby, the rotation axis a2 of the substrate 50 must be identical with a pattern for manufacturing the microlens of the X-ray mask M1, that is, the central axis a1 of the absorbing member 30.

Figure 6A:
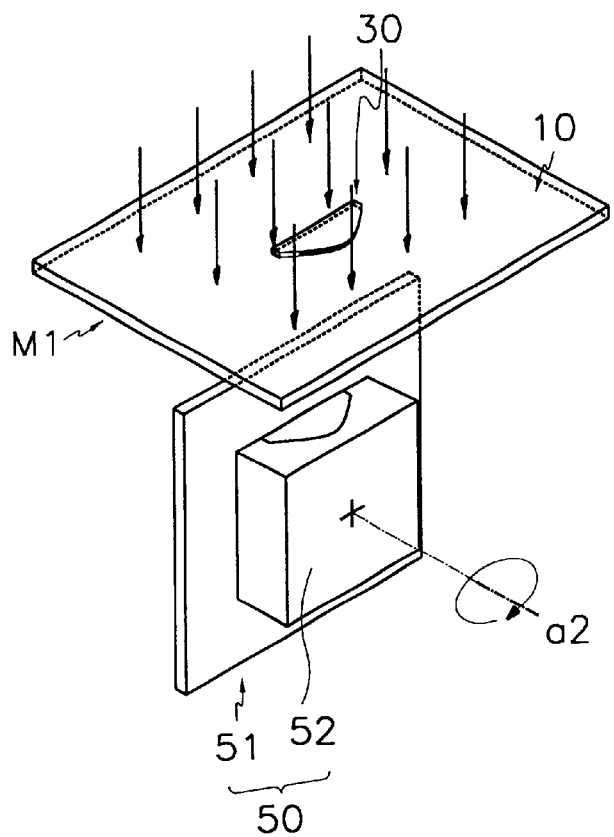
FIG. 6(a) shows an exposure process state for manufacturing the microlenses according to a first preferred embodiment of the present invention.
Figure 6B:
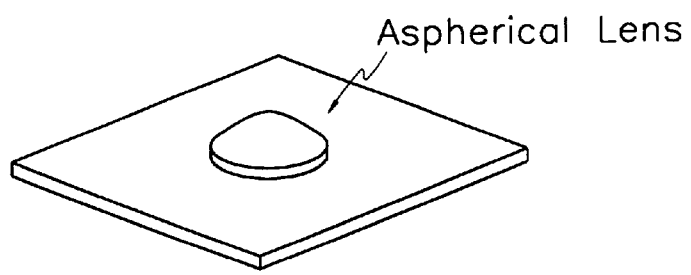
FIG. 6(b) shows the microlens manufactured according to the exposure process of FIG. 6(a)

After arranging the X-ray mask M1 and the substrate 50 as described above, a radiation accelerator (not illustrated) is driven so that the X-rays are applied to the X-ray mask M1 and the exposure process is performed. FIGS. 6(a) and (b) show exposure processes for manufacturing the microlens according to the first preferred embodiment of the present invention.

As shown in FIG. 6(a), the substrate 50 has a configuration wherein the PMMA 52 is formed on the substrate 51, and since the X-rays permeate the portion excluding the absorbing member 30 of the X-ray mask M1 as the X-rays are applied, the X-rays are not applied to the portion corresponding to the absorbing member 30 of the PMMA 52. At this time, the substrate 50 is not fixed but rotates on the rotation axis a2.

Since the substrate 50 is vertical with respect to the X-ray mask M1, the X-rays are applied to the side of the PMMA 52, and accordingly, since the thickness of the PMMA 52 on which the X-ray is applied increases, the X-rays are applied so that the X-ray energy stored in the other end of the PMMA 52 becomes sufficient. As the absorbing member 30 of the X-ray mask M1 covers the PMMA 52 of the exposure substrate 50, the thickness of the corresponding generated microlens can be changed. Therefore, the Y-axis direction micrometer 43 moves the X-ray mask M1 in the Y-axis direction so that an isolation degree of the X-ray applied to the PMMA 52 can be adjusted by the absorbing member 30.

After the exposure process is performed, the PMMA 52 on which the X-rays are partially applied is put into the developing solution and then developed, and some part of the PMMA 52 on which the X-rays are applied is etched such that a PMMA structure having the form of the microlens, which is the microlens is completed.

The PMMA structure itself as manufactured in the above method can be used as the microlens, and besides, a mold for injection molding microlenses can also be manufactured using the PMMA structure facilitating the manufacture of many microlenses.

On the other hand, since the absorbing member 30 of the X-ray mask M1 is removably installed, while the central axis a1 of the X-ray mask M1 is identical with the rotation axis a2 of the substrate 50, various types of structures can be manufactured, changing the absorbing member 30 in many ways. Hence, a time for arranging the X-ray mask M1 and the substrate 50 can be reduced.

FIGS. 7(a) through 7(g) show sequential processes for manufacturing a mold for injection molding the microlens according to the first preferred embodiment of the present invention.

Figure 7A:
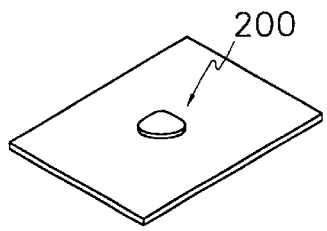
FIGS. 7(a) through (g) show sequential processes for manufacturing a mold for injection molding many microlenses by using the microlens as shown in FIG. 6(b)
Figure 7B:
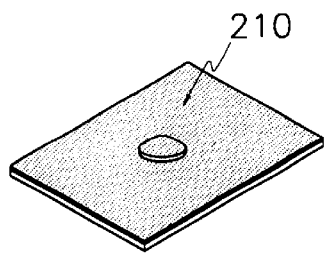
Figure 7C:
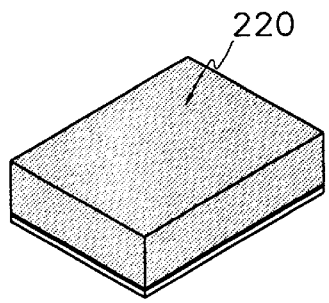

On a PMMA structure 200 as shown in FIG. 7(a), a plating base 210 for an electroplating process as shown in FIG. 7(b) is formed. A metal layer 220 is formed on the plating base 210 when the electroplating process is accomplished.

The metals used in the electroplating process are Ni, Ni—Fe, Ni—P, and Ni—W, and when using Ni, a surface strengthening process for extending the lifetime of the mold is effected. To perform the surface strengthening process, a electroless plating process is performed on Ni surface using Ni—P or Ni—B, or the surfaces of W or TiN are coated by a sputtering process. However, the mold is not limited to the above-noted metals.

Figure 7D:
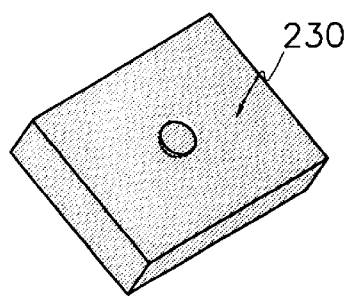
Figure 7E:
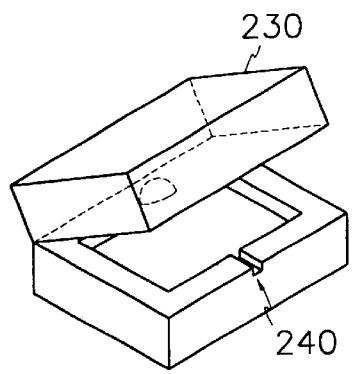

Next, as shown in FIG. 7(d), the metal layer 220 is separated from the PMMA structure 200 so that a mold 300 for manufacturing the microlens is completed. When combining the mold 230 with a mechanical mold 240, an injection mold as shown in FIG. 7(e) is formed.

Figure 7F:
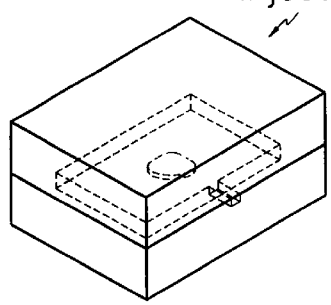
Figure 7G:
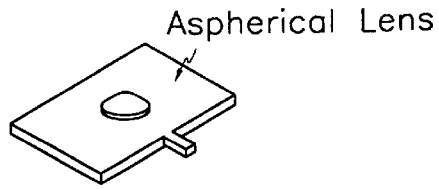

When the injection molding process is performed using the injection mold as shown in FIG. 7(f), a microlens having the form of FIG. 7(g) is manufactured.

Using the above injection mold, many microlenses can be produced. Since the injection mold is manufactured according to X-ray lithography, precise and minute microlenses can be easily manufactured.

In addition, when modifying the forms of the absorbing member, various lenses or other three-dimensional structures can be manufactured besides the microlenses having the form as mentioned above.

Figure 8:
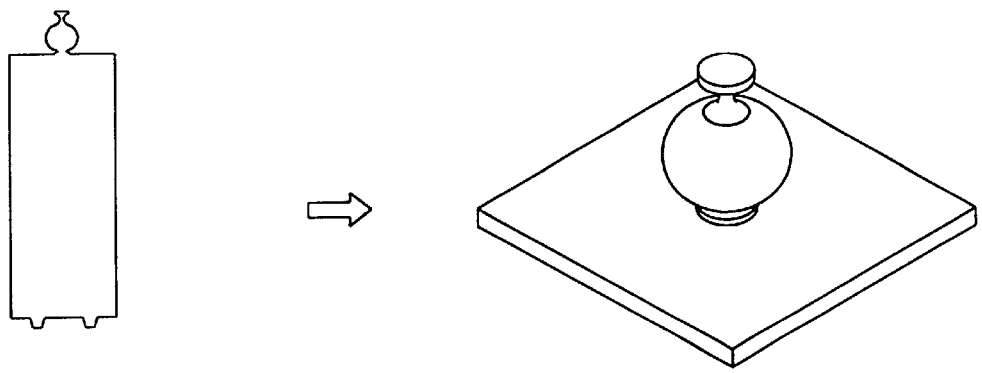
FIG. 8 illustrates various types of absorbing members of the X-ray mask and three-dimensional structures manufactured according to these types.
Figure 8:
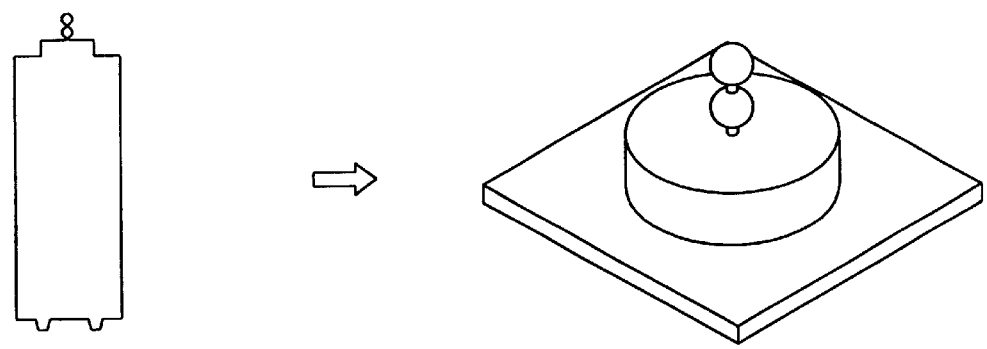

FIG. 8 shows various forms of the absorbing member of the exposure mask and three-dimensional structures manufactured according to these forms.

Next, a method for manufacturing the microlens according to a second preferred embodiment of the present invention will be described. The lens manufactured in the second preferred embodiment is a spherical lens.

FIGS. 9(a) through (h) show processes for manufacturing the aspherical microlens according to the second preferred embodiment of the present invention.

Figure 9A:
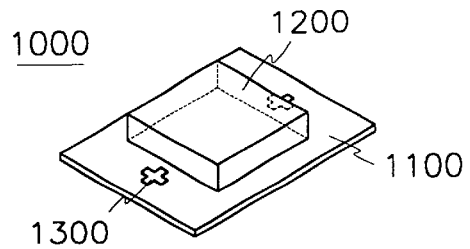
FIGS. 9(a) through (h) show microlens manufacturing processes using the X-ray lithography process according to a second preferred embodiment of the present invention.

As shown in FIG. 9(a), on a substrate 1100 is formed a sensitive film (PMMA 1200) which can react the X-rays and has a predetermined thickness so that a substrate 1100 is prepared. The substrate 1100 is a Si substrate, metallic substrate, or glass substrate. Alignment marks 1300 are formed on the substrate 1100 to arrange a lens in a predetermined position.

Figure 9E:
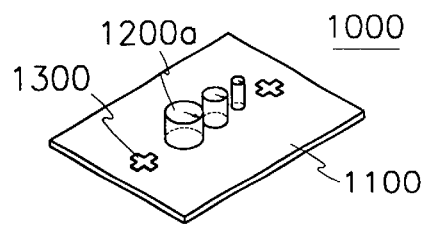
Figure 9B:
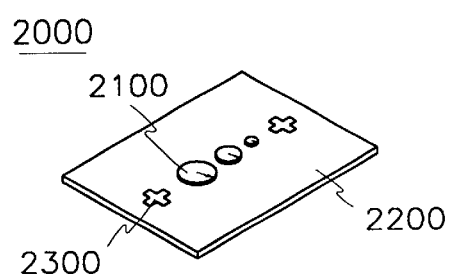

FIG. 9(b) shows an X-ray mask used in manufacturing the microlenses. The X-ray mask 2000 comprises an X-ray absorber 2100 having a desired lens type (curvature R) to be manufactured, a membrane 2200 which is easily permeated by the X-rays, and alignment marks 2300 are aligned for arrangement with the substrate 1100.

Figure 9F:
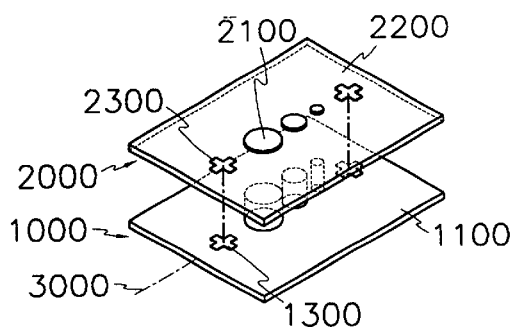
Figure 9C:
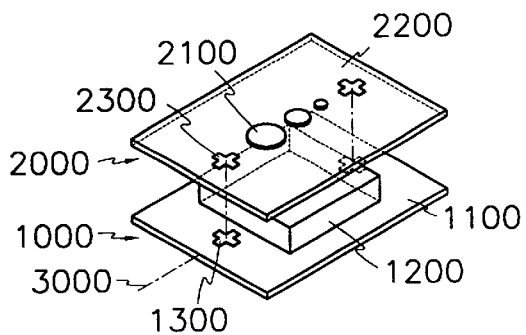

FIG. 9(c) shows an arrangement before the X-rays are radiated. First, the alignment marks 1300, 2300.

Figure 9G:
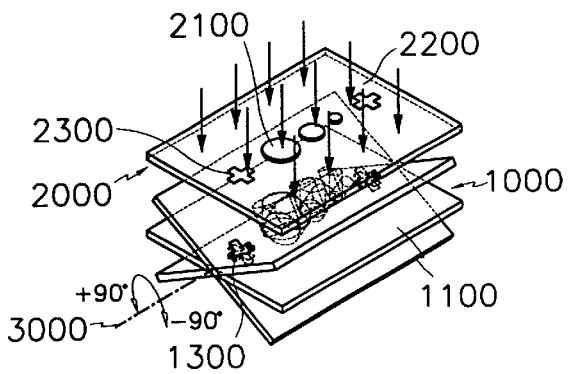
Figure 9D:
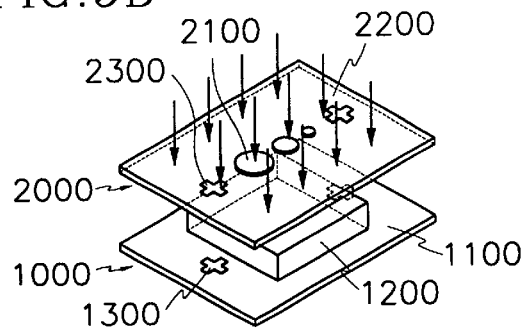

FIG. 9(d) shows an exposure process. At this time, since the substrate 1000 is not rotated but rather exposed, an arrangement of the substrate 1000 and the rotation axis 3000 of FIG. 9(c) is not needed. When developing the substrate 1000, a cylindrical pattern 1200a of FIG. 9(e) is formed.

FIG. 9(f) shows an arrangement of the exposure substrate 10 and the rotation axis 3000. After the alignment marks 1300 and the rotation axis 3000 of the substrate 1000 are arranged, the X-ray mask 2000 and the substrate 1100 are arranged.

In the microlens manufacturing process according to the present invention, when the X-rays are radiated, the substrate 1100 is rotated. Therefore, when the arrangement between the substrate 1100 and the rotation axis 3000, and the arrangement between the X-ray mask 2000 and the substrate 1100 is not performed precisely, the microlens can have undesired forms. Therefore, this arrangement process determines the precision of the microlens.

FIG. 9(g) shows an X-ray exposure process. In this exposure process, the X-ray mask 2000 is fixed, and the substrate 1000 is rotated to the right and left (−90°~+90°) to be exposed. Since the X-rays cannot easily permeate the spherical pattern of the absorber 2100 of the X-ray mask 2000, a non-exposure part and the other exposure part are formed on the PMMA 1200 on the substrate 1100.

Figure 9H:
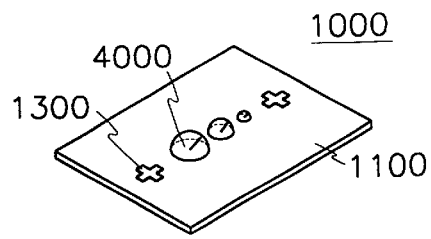

As shown in FIG. 9(h), a developing process for forming patterns is performed on the PMMA 1200 by using the developing speed differences between the part on which the X-rays are applied and the other part to which the X-rays are not applied. After development, the exposed part of the PMMA 1200 is completely removed and the unexposed part of the PMMA 1200 remains, so the semi-spherical microlens 4000 is formed on the substrate 1100. A plurality of microlenses 4000 can be formed on the rotation axis 3000.

Figure 10A:
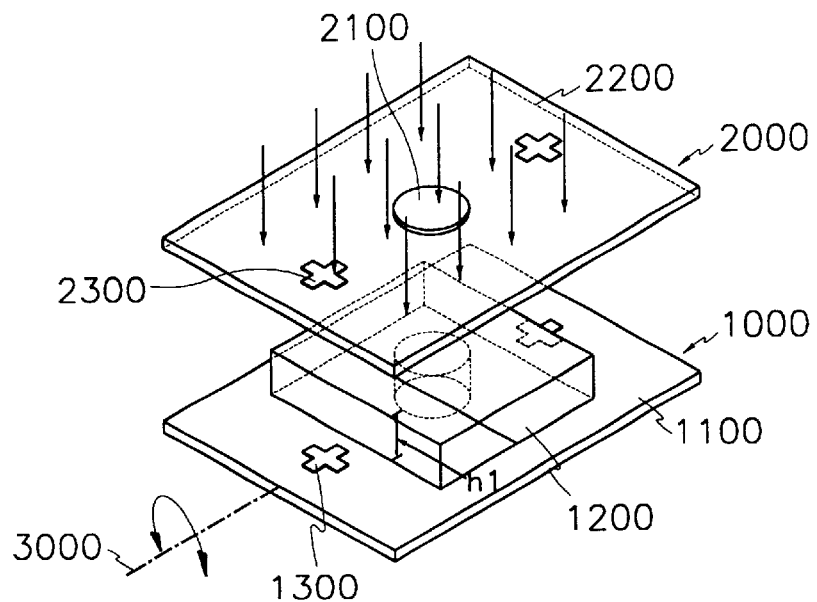
FIGS. 10(a) and (b) illustrate processes for showing problems that occur when manufacturing the microlens according to a second preferred embodiment of the present invention.

FIGS. 10(a) and (b) show problems which occur when the process of FIG. 9(d) for manufacturing a spherical pattern is omitted, and the process of FIG. 9(g) for rotating and concurrently exposing the exposure substrate 1000 is performed.

Figure 10B:
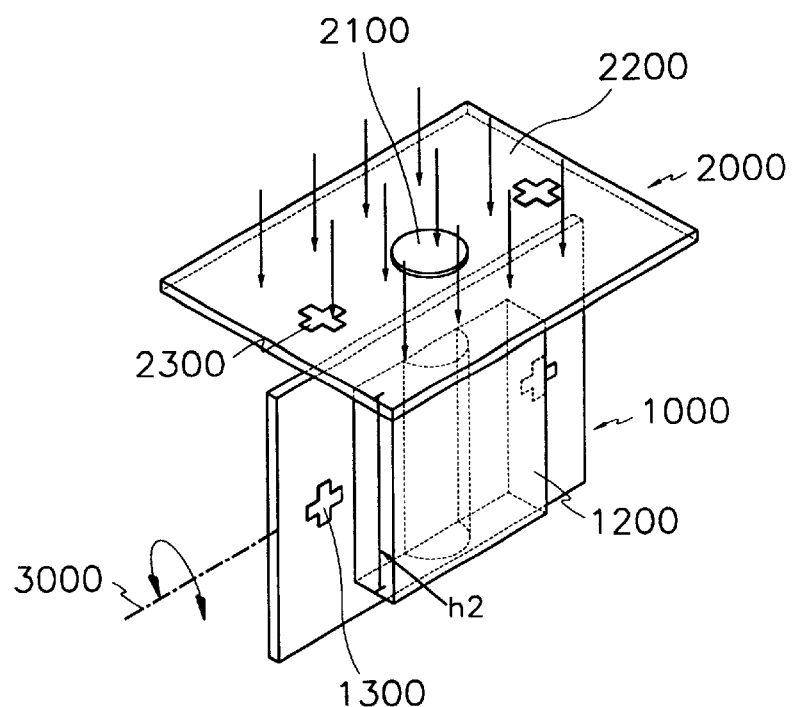

FIG. 10(a) shows when the exposure substrate 1000 is parallel with the X-ray mask 2000 at the time of exposure, and the depth of the PMMA 1200 that the X-ray permeates is h1. Since hi is the thickness of PMMA 1200 on the substrate 1000, the thickness is slightly thicker than that of the microlens. Therefore, h1 is a relatively small value. When rotating the substrate 1000 to 90° as shown in FIG. 10(b), the thickness that the X-rays permeate is h2 which is equal to the length of the PMMA 1200 in the vertical direction stuck to the substrate 1100. In preparation of the substrate 1000, the length is from some mm~some cm. Therefore, h2 is a large value. Accordingly, since the thickness of the PMMA 1200 that the X-ray permeates is very much larger in the exposure process of FIG. 10(b), the time to be spent completely exposing this thickness is much greater and if the thickness is too great, the exposure process can be impossible.

Therefore, to prevent this problem, it is desirable that the PMMA 1200 be patterned cylindrically, and that the exposure substrate 1000 be rotated and concurrently exposed as shown in FIG. 9(g). That is, since the PMMA 1200 has already been developed as a spherical pattern, even when rotating the exposure substrate 1000, the depth of the PMMA 1200 that the X-rays permeate is not deep, and therefore the exposure process can be smoothly performed.

FIGS. 11(a) through (g) show processes for performing an electroplating process on the patterns of the microlens manufactured by the process of FIG. 9, manufacturing a mold for injection molding the microlens, and manufacturing the microlens.

Figure 11A:
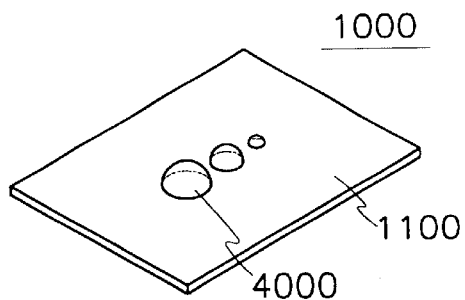
FIGS. 11(a) through (g) show processes for manufacturing a mold for injection molding the microlenses, and for injecting and molding the microlenses using the mold according to a second preferred embodiment of the present invention.
Figure 11B:
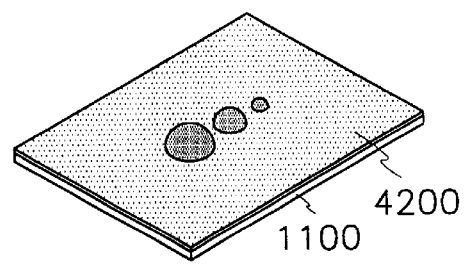
Figure 11C:
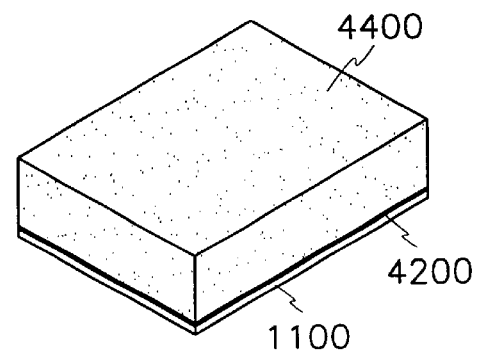
Figure 11D:
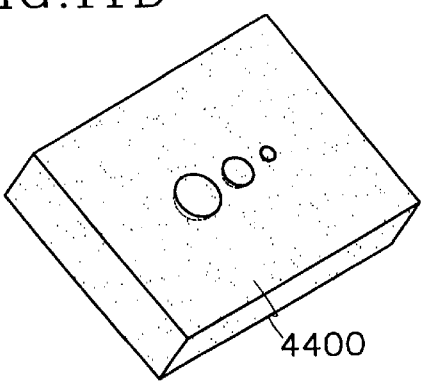
Figure 11E:
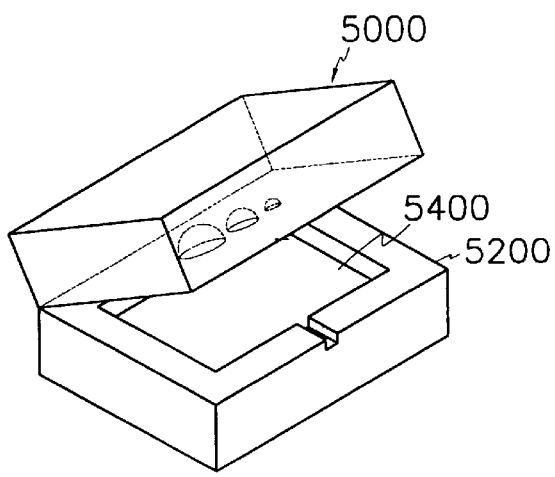
Figure 11F:
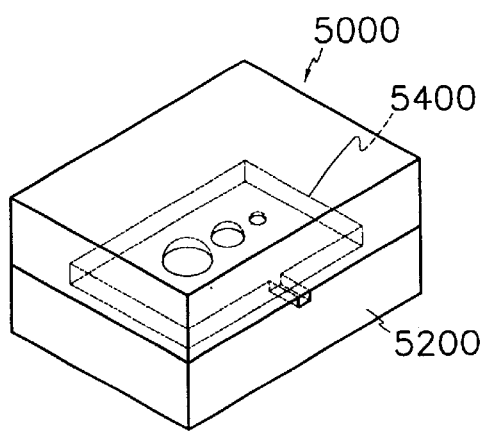
Figure 11G:
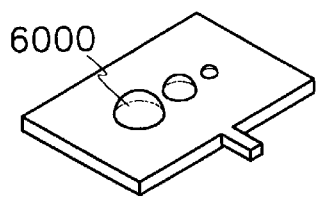

FIG. 11(a) shows the microlens manufactured by the present invention. FIG. 11(b) shows a plating base formed on the manufactured microlens. FIG. 11(c) shows an electroplating process where Ni, NiFe, NiP and NiW are used to perform the electroplating process to form a plating layer 4400. FIG. 11(d) shows a process for separating the plating layer 4400 from the substrate 1100. On the inner side of the separated plating layer 4400 is formed a form opposite the microlens. FIG. 11(e) shows a process for combining the mold 5000 manufactured by the electroplating process and a subsequent process with a mold frame 5200 manufactured by a machining process. FIG. 11(f) shows a process for molding a microlens forming material into a cavity 5400 formed between the mold 5000 and the mold frame 5200. FIG. 11(g) shows that molded material separated from the mold 5000 and the mold frame 5200 to form the microlens 6000 by the injection molding process.

Next, a method for manufacturing the microlens according to a third preferred embodiment of the present invention will be described. The lens manufactured in the third preferred embodiment is a ball lens.

Figure 12A:
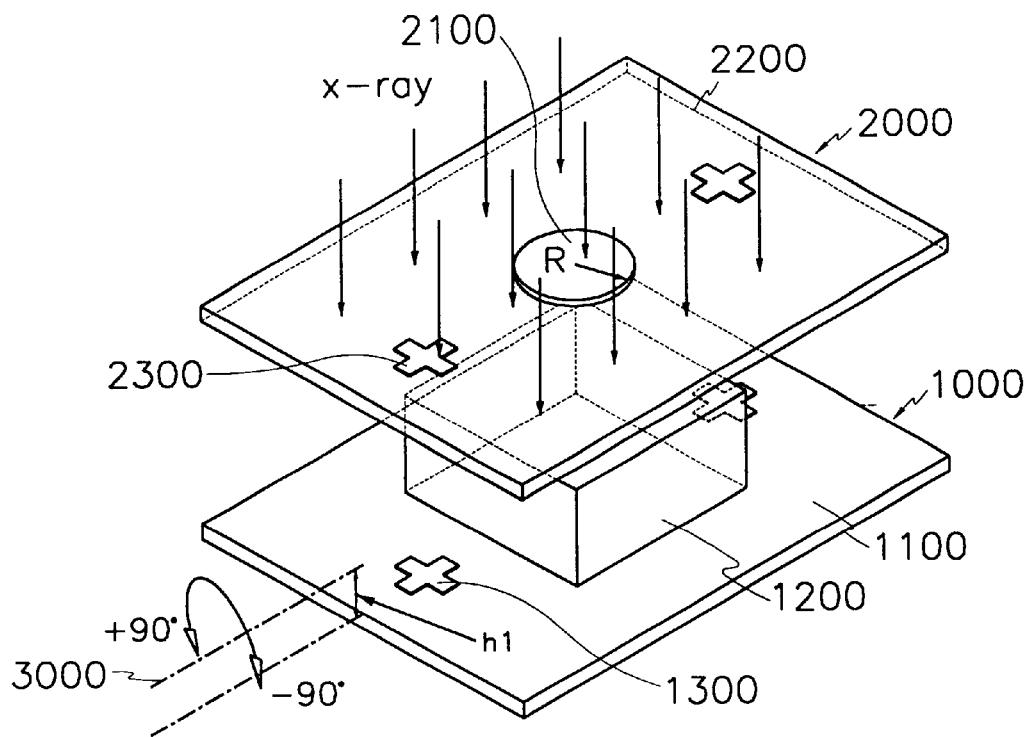
FIGS. 12(a) and (b) show processes for manufacturing a ball lens according to a third preferred embodiment of the present invention.
Figure 12B:
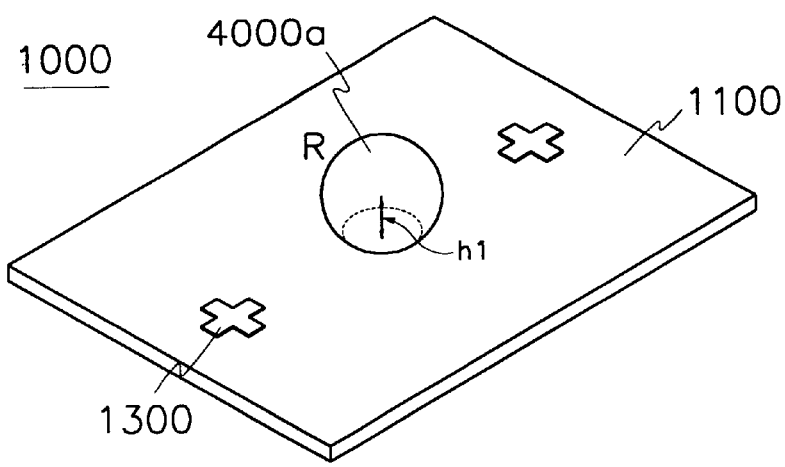

FIG. 12 shows a method for forming a microlens on the substrate 1100 according to the third preferred embodiment of the present invention. A difference between the method of FIG. 12 and that of FIG. 9 is that the rotation axis 3000 is not placed on the substrate 1100 but rather at a position a predetermined length h1 above the substrate 1100, as shown in FIG. 12(b). When positioning the rotation axis 3000 at a place higher than the substrate 1100 and performing an exposure process while rotating the substrate 1000, a ball 4000a, a bottom of which is partially cut, can be manufactured on the substrate 1100.

Figure 13:
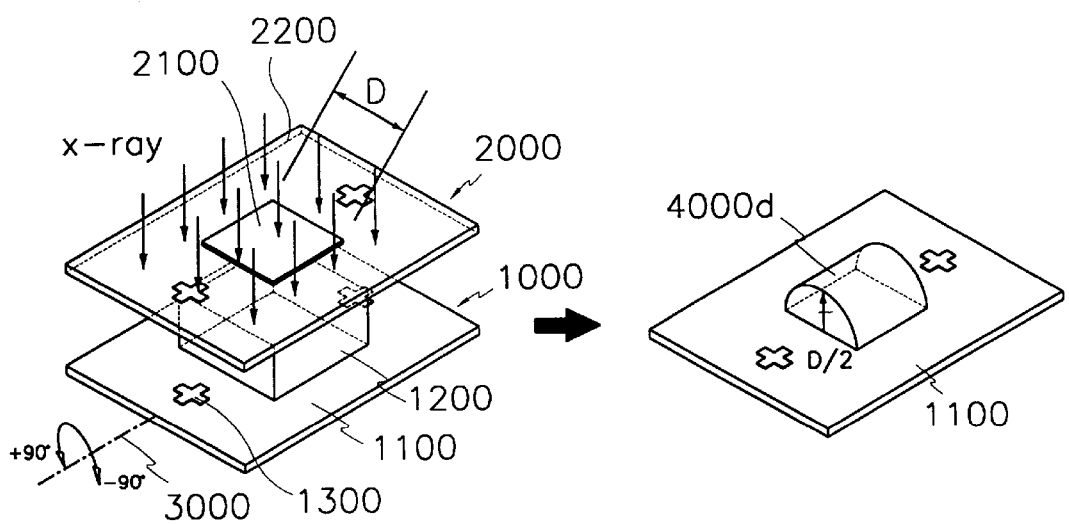
FIG. 13 shows a manufacturing process for making a semi-cylindrical lens according to a fourth preferred embodiment of the present invention.

FIG. 13 shows a pattern of the X-ray mask 2000 for manufacturing a semi-cylindrical lens, a manufacturing method, and a manufactured form of the microlens according to a fourth preferred embodiment of the present invention. To manufacture the semi-cylindrical lens as shown in FIG. 13, the absorber 2100 of the X-ray mask 2000 is patterned as a rectangular form, and the substrate 1100 is rotated and exposed. The radius of the manufactured microlens 4000d is one half of a width D of the pattern of the absorber 2100 formed on the X-ray mask.

Figure 14:
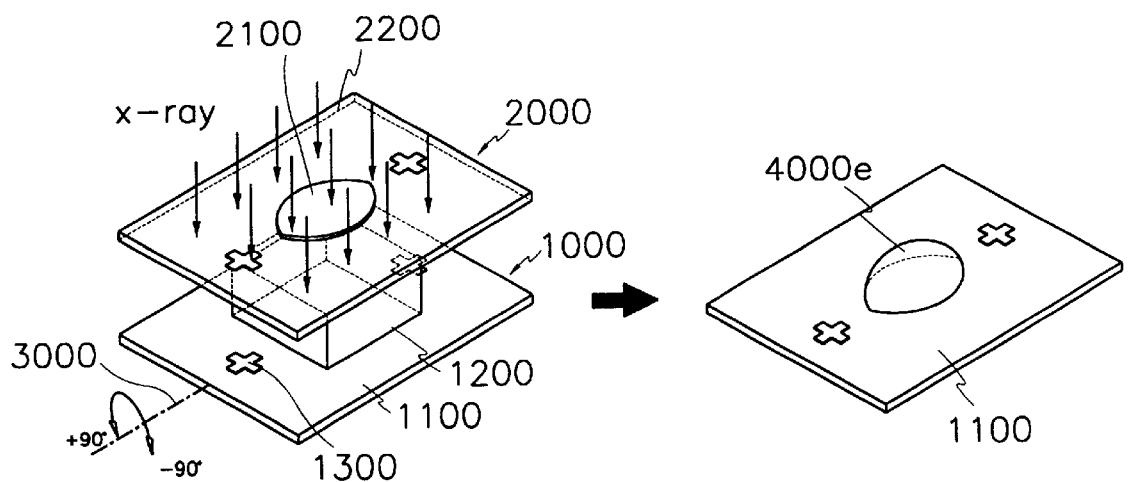
FIG. 14 shows a manufacturing process for making an elliptical lens according to a fifth preferred embodiment of the present invention.

FIG. 14 shows a pattern of the X-ray mask 2000 for manufacturing an elliptical lens, a manufacturing method, and a manufactured form of the microlens according to a fifth preferred embodiment of the present invention.

As show in FIG. 14, the elliptical microlens 4000e can be manufactured on the X-ray mask by using the pattern of the elliptical absorber 2100.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A microlens manufacturing method using X-ray lithography, comprising of steps of:
   (a) positioning an X-ray mask for manufacturing the microlens on a substrate on which a sensitive film is formed, and arranging a rotation axis of the substrate and a central axis of the X-ray mask;
   (b) applying X-rays to the X-ray mask to expose the sensitive film while fixing the X-ray mask and rotating the substrate; and
   (c) developing the sensitive film to form the microlens, wherein the X-ray mask comprises:
      a mask substrate permeating the X-rays;
      a holder fixedly installed on the mask substrate and defining a hole; and
      an absorbing member including an inserter removably formed in the hole, and having a microlens form, for absorbing the X-rays.

2. The method of claim 1, wherein in the step (b), the substrate is moved back and forth in an X-axis direction to make identical the rotation axis of the exposure substrate with the central axis of the exposure mask, and the substrate is moved back and forth in the Y-axis direction to adjust a thickness of the sensitive film exposed by the X-ray mask.

3. The method of claim 1, wherein in the step (b), the substrate is positioned in a direction vertical to the absorbing member of the X-ray mask, and the substrate is rotated 360° on the rotation axis to be exposed.

4. The method of claim 1, wherein protrusions are formed on the inserter of the absorbing member of the mask, and installing holes corresponding to the protrusions are defined within the hole of the holder of the X-ray mask.

5. The method of claim 1, wherein first protrusions are formed at an end of the inserter of the absorbing member, and first installing holes are defined at positions corresponding to the first protrusions, and second installing holes are defined at a side of the inserter of the absorbing member, and second protrusions are formed on the positions corresponding to the second installing holes within the hole of the holder.

6. A microlens manufacturing method using X-ray lithography, comprising the steps of:
   (a) positioning an X-ray mask for manufacturing the microlens on a sensitive film on a substrate, and arranging a rotation axis of the substrate and a central axis on the X-ray mask;
   (b) fixing the X-ray mask and rotating the substrate, and applying X-rays to the X-ray mask to expose the sensitive film;
   (c) developing the sensitive film and manufacturing a sensitive film structure having a microlens form;
   (d) forming a plating base on the sensitive film structure;
   (e) performing an electroplating procession the plating base to form a plating layer; and
   (f) separating the plating layer from the sensitive film structure and combining the plating layer with a mold frame for injection molding the microlens and manufacturing an injection mold.

7. The method of claim 6, wherein in the step (a), the X-ray mask is moved back and forth in an X-axis direction to make the rotation axis of the substrate identical with the central axis of the X-ray mask, and the X-ray mask is moved back and forth in an Y-axis direction to adjust a thickness of the sensitive film exposed by the X-ray mask.

8. A microlens manufacturing method using X-ray lithography, comprising the steps of:
   forming a layer comprised of one of the group consisting of PolyMethylMetrAcrylate (PMMA) and a sensitive film with a predetermined thickness on a substrate;
   arranging an X-ray mask and the substrate;
   exposing the substrate using the X-ray mask, and removing the exposed layer using a developing solution;
   arranging the X-ray mask and a rotation axis on the substrate;
   fixing the X-ray mask, and rotating and exposing the substrate so as to expose the substrate into a geometric form according to an absorbing member of the X-ray mask and the position of the rotation axis; and
   removing the exposed layer from the substrate using the developing solution to develop the substrate as a geometric form,
   wherein the absorbing member of be X-ray mask is formed in a rectangular form, and the substrate is rotated and exposed to form a Simi-cylindrical lens.

9. The method of claim 8, wherein the rotation axis of the substrate is formed above the substrate with a predetermined height to manufacture a ball lens type microlens.

10. A microlens manufacturing method using X-ray lithography, comprising the steps of:
    forming a layer comprised of one of the group consisting of PolyMethyLMethAcrylate (PMMA) and a sensitive film with a predetermined thickness or a substrate;
    arranging an X-ray mask and the substrate;
    exposing the substrate using the X-ray mask, and removing the exposed layer using a developing solution;
    arranging the X-ray mask and a rotation axis on the substrate;
    fixing the X-ray mask, and rotating and exposing the substrate so as to expose the substrate into a geometric form according to an absorbing member of the X-ray mask and the position of the rotation axis; and
    removing the exposed layer from the substrate using the developing solution to develop the substrate as a geometric form,
    wherein the absorbing member of the X-ray mask is formed in an oval form and the substrate is rotated and exposed to form an oval lens.

11. A microlens injection mold manufacturing method using X-ray lithography, comprising the steps of:
    forming a layer comprised of one of the group consisting of PolyMethylMethAcrylate (PMMA) and a sensitive film with a predetermined thickness on a substrate;
    arranging the X-ray mask and a rotation axis of the substrate;
    fixing the X-ray mask, and rotating and exposing the substrate so as to expose the substrate into a geometrical form according to an absorbing member of the X-ray mask and the position of the rotation axis;
    removing the exposed layer from the substrate using the developing solution to develop a structure as a geometric form;
    forming a plating base on the structure;
    forming a metal layer on the plating base using an electroplating process; and
    separating the metal layer from the substrate and combining the metal layer with a mold frame for injection molding a form of the structure formed on the metal layer.

* * * * *

UNITED STATES PATENT AND TRADEMARK OFFICE
CERTIFICATE OF CORRECTION

PATENT NO. : 6,558,878 B1 Page 1 of 1
DATED : May 6, 2003
INVENTOR(S) : Park et al.

It is certified that error appears in the above-identified patent and that said Letters Patent is hereby corrected as shown below:

<u>Column 9,</u>
Line 3, "of", first occurrence, should read -- the --;
Line 54, "procession" should read -- process on --.

<u>Column 10,</u>
Line 2, "PolyMethylMetrAcrylate" should read -- PolymethylMethAcrylate --;
Line 17, "be" should read -- the --;
Line 19, "Simi-cylindrical" should read -- semi-cylindrical --;
Line 26, "PolyMethyLMethAcrylate" should read -- PolyMethylMethAcrylate --;
Line 27, "or" should read -- on --.

Signed and Sealed this

Twenty-ninth Day of July, 2003

JAMES E. ROGAN
*Director of the United States Patent and Trademark Office*